(12) United States Patent
Reykowski

(10) Patent No.: US 7,608,778 B2
(45) Date of Patent: Oct. 27, 2009

(54) COAXIAL TEST CABLE ASSEMBLY

(75) Inventor: Arne Reykowski, Gainesville, FL (US)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/679,241

(22) Filed: Feb. 27, 2007

(65) Prior Publication Data

US 2007/0201178 A1    Aug. 30, 2007

(30) Foreign Application Priority Data

Feb. 27, 2006   (DE) .................. 10 2006 009 040

(51) Int. Cl.
*H01B 11/06* (2006.01)
(52) U.S. Cl. .................................................. 174/36
(58) Field of Classification Search .................. 174/28, 174/36; 333/12
See application file for complete search history.

(56) References Cited

U.S. PATENT DOCUMENTS

| | | | |
|---|---|---|---|
| 2,841,792 A | 7/1958 | Edson et al. | |
| 5,294,886 A | 3/1994 | Duerr | |
| 6,822,846 B2 | 11/2004 | Reykowski | |
| 2003/0173099 A1* | 9/2003 | Reykowski | ............... 174/35 R |
| 2005/0270116 A1 | 12/2005 | Hergt et al. | |

FOREIGN PATENT DOCUMENTS

DE    10 2004 015 856 A1    10/2005

\* cited by examiner

*Primary Examiner*—Chau N Nguyen
(74) *Attorney, Agent, or Firm*—Schiff Hardin LLP

(57) ABSTRACT

A coaxial cable comprises at least one internal conductor and a surrounding cable shield. A plurality of sheath wave barriers are arranged along the cable shield, each having two ends that are coupled to the cable shield at coupling points of the cable shield that are spaced from one another. The coaxial cable is exposed to a radio-frequency excitation field with an excitation frequency, due to which sheath waves can be excited on the cable shield. The excitation field is shielded from the at least one internal conductor via the cable shield. The sheath waves can be damped via the sheath wave barriers. A detection circuit is associated with at least one of the sheath wave barriers, from which detection circuit a measurement signal characteristic of a load of the respective sheath wave barrier due to the excitation field can be generated. The measurement signal can be tapped and evaluated.

12 Claims, 4 Drawing Sheets

Evaluation Device

Viewing Device

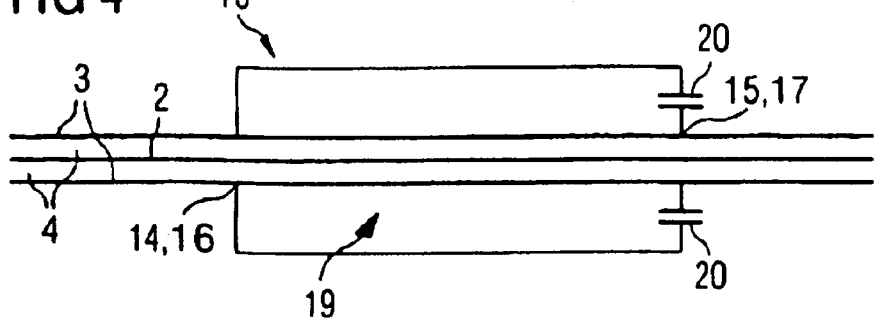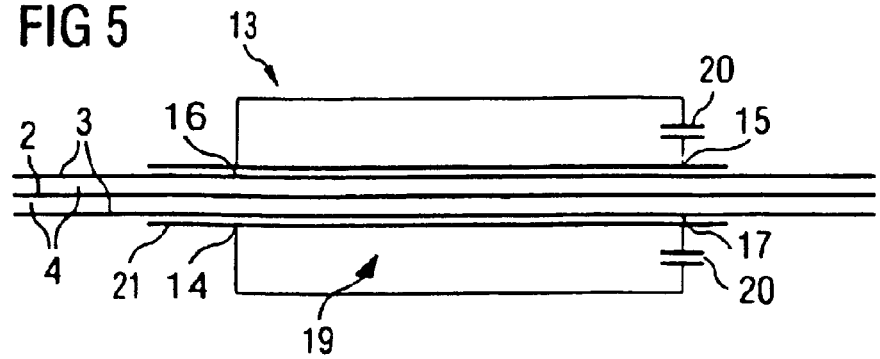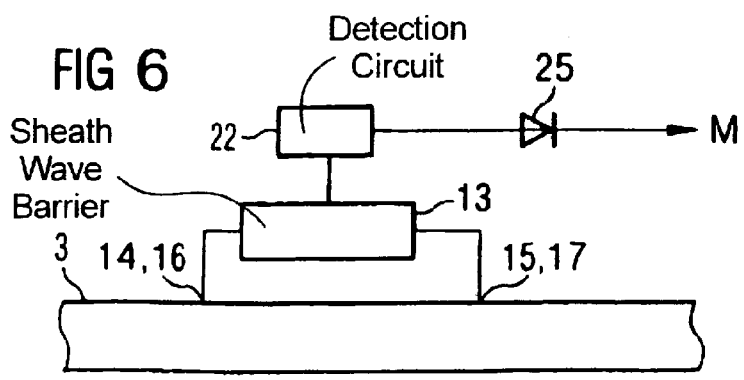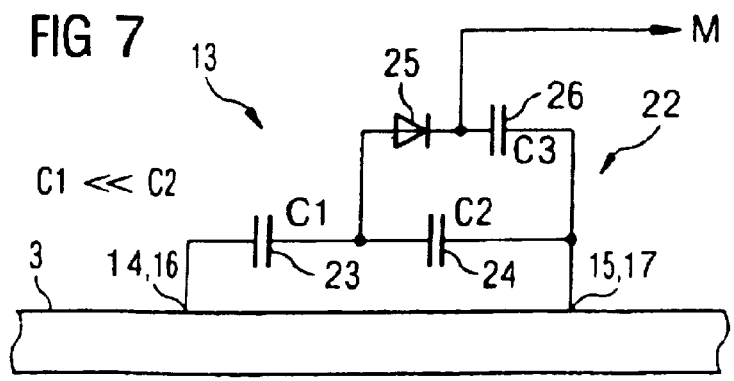

COAXIAL TEST CABLE ASSEMBLY

BACKGROUND

The present invention concerns a coaxial cable with at least one internal conductor and a cable shield surrounding the at least one internal conductor. It also concerns a testing method for such a coaxial cable.

Coaxial cables are generally known. The normally comprise a single internal conductor and a cable shield concentrically surrounding the internal conductor. However, coaxial cables are also already known that comprise a plurality of internal conductors arranged concentrically relative to one another, for example, the "Clogston conductor" (see, for example, FIG. 3 of U.S. Pat. No. 2,841,792). Such coaxial cables are also considered to be coaxial cables in the sense of the present invention.

Coaxial cables are used in, among other things, magnetic resonance systems in order to connect "local coils" with a control and evaluation device. The local coils are spatially arranged such that they can detect magnetic resonances that were excited immediately prior in an examination subject via a radio-frequency excitation field with an excitation frequency. The excitation frequency normally corresponds to the Larmor frequency of the appertaining magnetic resonance system.

During the excitation of the magnetic resonances, the cable shield is likewise exposed to the excitation field. Sheath waves that oscillate with the excitation frequency can thereby be excited on the cable shield.

In the prior art, it is known to arrange a plurality of sheath wave barriers along the cable shield. Each sheath wave barrier comprises two ends, whereby the ends are coupled to the cable shield at coupling points of the cable shield that are separated from one another. The sheath waves that are excited on the cable shield due to the excitation field can be damped via the sheath wave barriers.

The coupling of the sheath wave barriers to the cable shield can be direct and permanent (see, for example, U.S. Pat. No. 5,294,886 German Patent Document No. 10 2004 015 856). However, the sheath wave barriers can also be shunted to the cable shield and possibly even be displaceable along the cable shield in operation (see, for example, U.S. Pat. No. 6,822,846). Both types of the coupling are also possible in the scope of the present invention.

Like any other component, sheath wave barriers can also fail. When a sheath wave barrier fails, the danger exists that a usable signal that should be transferred over the at least one internal conductor is corrupted or otherwise impaired. Local high voltage levels and/or high currents can also be induced on the cable shield. The examination subject can be harmed by this. Consequential damages (for example, to the cable shield, to the local coil or to the control and evaluation device of the magnetic resonance system) can also result.

SUMMARY

The object of the present invention is to provide a coaxial cable and a testing method for a coaxial cable via which a malfunction of sheath wave barriers can be detected at least in a portion of the possible application cases.

The object is achieved for the coaxial cable in that a detection circuit is associated with at least one of the sheath wave barriers, from which detection circuit a measurement signal that is characteristic for a load of the respective sheath wave barrier due to the excitation field can be generated that can be tapped and evaluated.

The object is hereby correspondingly achieved for the test method in that the coaxial cable is exposed to the excitation field that is generated via the detection circuit and in that the measurement signal is tapped and evaluated.

Various embodiments of the invention is based on the realization that, in the event that one of multiple sheath wave barriers fails, the remaining, intact sheath wave barriers are more significantly loaded. If the exposure of the sheath wave barrier provided with the detection circuit exceeds a limit load, this can be viewed as an indication that one or more of the remaining sheath wave barriers are defective. A failure limitation is even possible in such a way that a malfunction of another sheath wave barrier that is arranged in the proximity of an excessively-loaded sheath wave barrier is concluded from an excessive load of the specific sheath wave barrier.

In a preferred embodiment, the detection circuit comprises a rectifier element via which a radio-frequency excitation signal excited in the respective sheath wave barrier by the excitation field can be rectified. In this case, the measurement signal corresponds to the rectified excitation signal. The evaluation of the measurement signal is then possible in a particularly simple manner. In the simplest case, a diode is used as a rectifier element. However, more complex rectifier elements can also be used, for example, bridge rectifiers via which a full wave rectification is possible.

The respective sheath barrier advantageously comprises a series circuit of two capacitor elements arranged between the ends of the respective sheath wave barrier, whereby the rectifier element is connected in parallel with the capacitor elements. The rectifier element is then only loaded with a portion of the voltage occurring in the respective sheath wave barrier. The same applies for possible components connected downstream from the rectifier element.

The capacitor elements are advantageously dimensioned such that, together with the cable shield (insofar as it is located between the two coupling points) they form a blocking loop [resonant cavity] resonant at the excitation frequency. The sheath wave barrier is then particularly effective.

The two capacitor elements can alternatively exhibit equal capacitance values or capacitance values differing from one another. When they exhibit capacitance values differing from one another, the rectifier element is advantageously connected in parallel with that of the capacitor elements that exhibits the greater capacitance value.

A capacitive storage element for buffering of the measurement signal is advantageously arranged downstream of the rectifier element. The measurement signal is then particularly stable and moreover can be tapped simply.

The evaluation of the measurement signal advantageously comprises a comparison of the measurement signal with a reference signal determined using the excitation field. It is then possible immediately and without further measures to set the measurement signal in relation to a theoretical maximum load to be expected.

A malfunction of a different sheath wave barrier than the sheath wave barrier with which the detection circuit is associated is advantageously detected when a quotient of the measurement signal and the reference signal exceeds a threshold. The evaluation of the measurement signal is then particularly simple. The evaluation can ensue intellectually by a person; however, it can also be effected by a control and evaluation circuit.

It is possible that the detection of the malfunction initiates an output of a warning signal that is immediately perceivable by a person with one of his physical senses. In this case, a corresponding reaction of the person who considers the malfunction is expected.

When the testing method is implemented in a system, alternatively or in addition to the output of the aforementioned warning signal, it is also possible that the detection of the malfunction initiates a blocking signal on the basis of which a start of a measurement sequence of the system is blocked.

DESCRIPTION OF THE DRAWINGS

Further advantages and details result from the subsequently specification of exemplary embodiments in connection with the drawings and descriptive text below.

FIGS. 3-5 are schematic illustrations showing possible embodiments of sheath wave barriers;

FIGS. 6-8 are schematic illustrations showing possible embodiments of detection circuits.

DETAILED DESCRIPTION OF THE PREFERRED EMBODIMENTS

Figure 1:
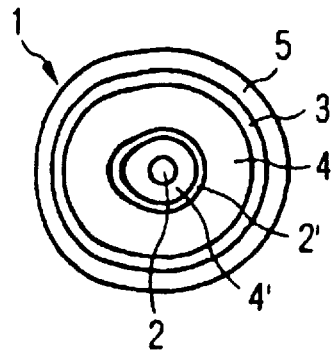
FIG. 1 is a pictorial cross-section through a coaxial cable.

According to FIG. 1, a coaxial cable 1 comprises an internal conductor 2 and a cable shield 3. A dielectric is arranged between the internal conductor 2 and the cable shield 3. The cable shield 3 is surrounded by a cable cladding/sheath that comprises electrically-insulating material.

The coaxial cable 1 from FIG. 1 comprises only a single internal conductor 2. However, it would also be possible that further internal conductors 2' are present in addition to this internal conductor 2.

This is schematically indicated in FIG. 1 for a further internal conductor 2'. The internal conductor 2 and the further internal conductor 2' are separated from one another by a further dielectric 4' in this case. In this case the dielectric 4 is arranged between the outermost further internal conductor 2' and the cable shield 3.

Figure 2:
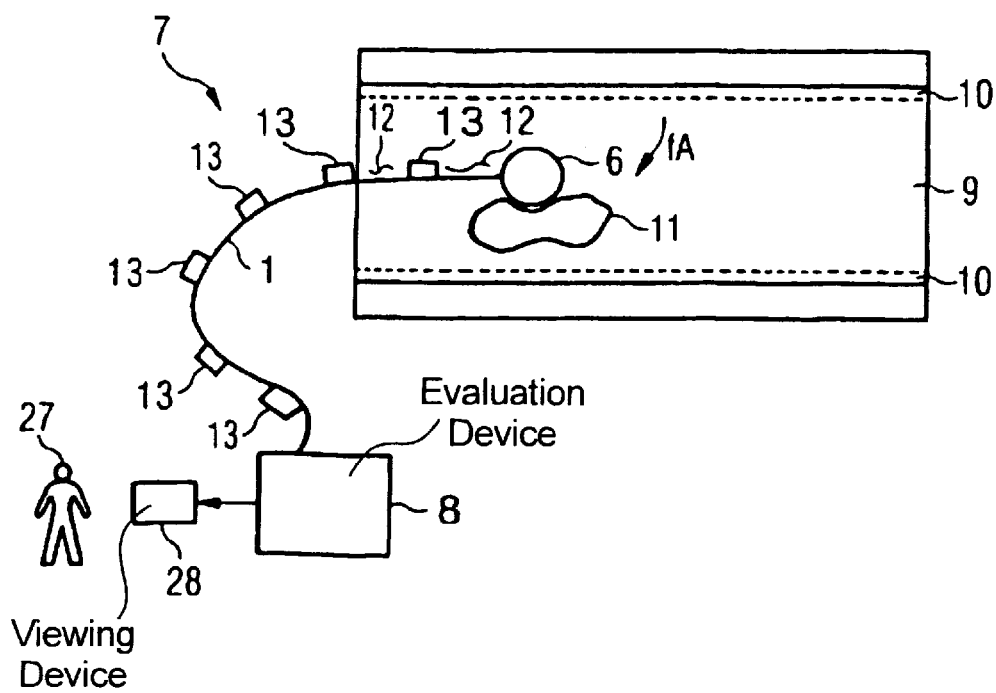
FIG. 2 is a schematic diagram of a magnetic resonance system.

According to FIG. 2, the coaxial cable 1 of FIG. 1 can, for example, be used to transfer a magnetic resonance signal from a local coil 6 of a magnetic resonance system 7 to a control and evaluation device 8 of the magnetic resonance system 7. In this case the local coil 6 is arranged within an effective range 9 of a radio-frequency transmission antenna 10 of the magnetic resonance system 7, the control and evaluation device 8 is arranged outside of the effective range.

In operation of the magnetic resonance system the radio-frequency transmission antenna 10 emits an excitation field that possesses an excitation frequency fA. An examination subject 11 can be excited to magnetic resonances via the excitation field. The examination subject 11 is only schematically represented in FIG. 2.

The excited magnetic resonances are acquired via the local coil 6 and supplied to the control and evaluation device 8 via the internal conductor 2 and/or possibly also one of the further internal conductors 2' of the coaxial cable 1.

During the transmission operation of the radio-frequency transmission antenna 10, the coaxial cable 1 is exposed to the excitation field. During the transmission operation of the radio-frequency transmission antenna 10, the excitation field emitted by this is shielded from the internal conductor 2 and possibly also from the further internal conductors 2' by way of the cable shield 3.

Furthermore, sheath waves 12 are excited on the cable shield 3 due to the excitation field. The excitation ensues directly and immediately, this particularly from the outside, not via the internal conductor 2 or a further internal conductor 2'.

The sheath waves 12 exhibit a frequency that corresponds with the excitation frequency fA. If they are not damped, the sheath waves 12 can induce significant voltages and currents on the cable shield 3. Therefore a plurality of sheath wave barriers 13 are arranged along the cable shield 3 to dampen the sheath waves 12.

The sheath wave barriers 13 can be fashioned in various ways. Various possible designs of the sheath wave barriers 13 are briefly explained in the following in connection with FIGS. 3 through 5. It is common to the sheath wave barriers 13 of FIGS. 3 through 5 that the sheath wave barriers 13 respectively exhibit two ends 14, 15 and that the ends 14, 15 are coupled to the cable shield 3 at coupling points 16 and 17 of the cable shield 3 that are spaced from one another.

Figure 3:
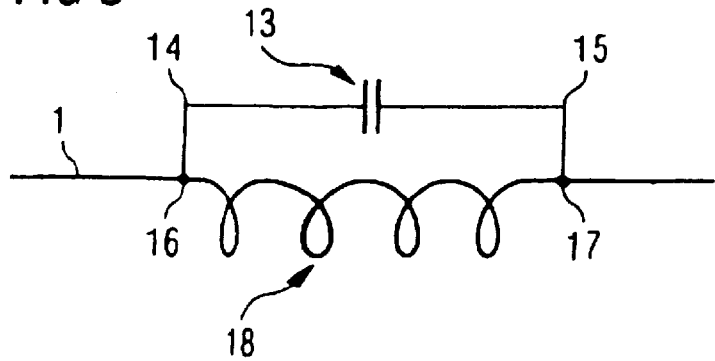

According to a first possible embodiment of a sheath wave barrier 13 according to FIG. 3, a segment 18 of the coaxial cable 1 is shaped into a plurality of windings. The coupling points 16, 17 at which the sheath wave barrier 13 with its ends 14, 15 is coupled is located at the ends of the segment 18. The sheath wave barrier 13 of FIG. 3 is, as such, fashioned as a simple capacitor.

In the embodiment according to FIG. 4 the sheath wave barrier 13 is fashioned as a blocking pot that surrounds the coaxial cable 1 along a segment 19. The blocking pot 13 is closed axially on one side, open axially on one side and radially spaced from the cable shield 3. It is coupled directly at its closed end to the cable shield 3, at its open end via a capacitor 20. For reasons of proper order it is mentioned that the blocking pot 13 itself already acts as a capacitor.

According to FIG. 5 the sheath wave barrier 13 is also fashioned as a blocking pot. In contrast to FIG. 4, the blocking pot 13 is arranged on a support structure 21 that is slid onto the cable shield 3. In contrast to the embodiments of FIGS. 3 and 4, in this case no direct galvanic connection of the sheath wave barrier 13 to the cable shield 3 therefore exists, rather only an inductive coupling.

According to FIGS. 2 and 6, a detection circuit 22 is associated with at least one of the sheath wave barriers 13. A measurement signal M can be generated by the detection circuit 22. The measurement signal M is characteristic of a load of the respective sheath wave barrier 13 due to the excitation field. The measurement signal M is thus characteristic of the strength of the excitation field. It is proportional to the strength of the excitation field. The measurement signal M can be tapped and evaluated, for example by the control and evaluation circuit 8.

FIG. 7 shows a preferred embodiment of the sheath wave barriers 13 with which a detection circuit 22 is associated. According to FIG. 7, these sheath wave barriers 13 comprise a series circuit of two capacitor elements 23, 24. This series circuit is arranged between the ends 14, 15 of the respective sheath wave barrier 13. Applied to FIG. 3, the series circuit of the capacitor elements 23, 24 can, for example, be created via suitable division of the capacitor shown in FIG. 3. Applied to FIGS. 4 and 5, each one of the capacitor elements 23, 24 corresponds to the blocking pot or, respectively, the capacitor 20.

A rectifier element 25 is connected in parallel with one of the capacitor elements 23, 24. According to FIG. 7, the rectifier element 25 is fashioned as a simple diode. However, it could also be of more complex design, in particular as a bridge rectifier 25. This is schematically shown in FIG. 8.

Independent of the concrete embodiment of the rectifier element 25, a radio-frequency excitation signal that is excited in the respective sheath wave barrier 13 by the excitation field is rectified via the rectifier element 25. The measurement signal M corresponds to the rectified excitation signal, thus, according to FIGS. 7 and 8, to the amplitude of the alternating voltage arising via the capacitor element 24. The detection circuit 22 thus generates the measurement signal M characteristic for the load of the respective sheath wave barrier 13 in that it rectifies the excitation signal.

Figure 8:
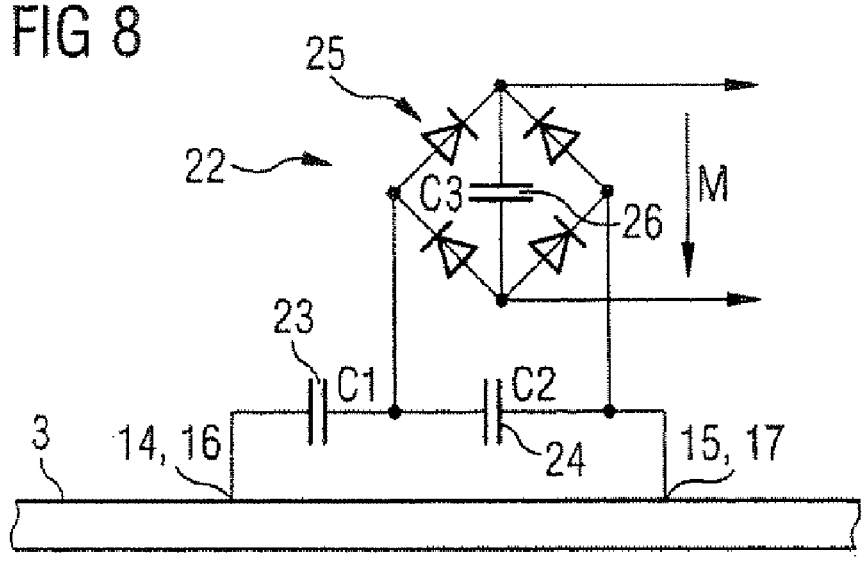

For buffering and stabilization of the measurement signal M, according to FIGS. 7 and 8, a capacitive storage element 26 is arranged downstream of the rectifier element 25. The measurement signal M is buffered in the capacitive storage element 26.

As already mentioned, the embodiments of FIGS. 7 and 8 are preferred. However, they are not absolutely necessary. The capacitive storage element 26 could particularly be omitted if the tap is designed in a sufficiently high-ohmic manner. The rectification could also possibly be omitted if the excitation signal can be directly detected and evaluated.

The capacitor elements 23, 24 of the series circuit can exhibit the same capacitance value. However, they advantageously exhibit capacitance values C1, C2 differing from one another. That of the capacitor elements 23, 24 with which the rectifier element is connected in parallel particularly advantageously exhibits the greater capacitance value C2. A quotient of the capacitance values C1, C2 is normally distinctly different than one. It often lies between 3 and 15, for example between 5 and 10.

The capacitor elements 23, 24 are advantageously dimensioned such that, together with the cable shield 3 (insofar as it is located between the two coupling points 16, 17), they form a blocking loop resonant at the excitation frequency fA. This should be understood such that the capacitance value C3 of the capacitive storage element 26 is not taken into account in the dimensioning of the capacitor elements 23, 24.

Due to the inventive embodiment of the coaxial cable 1, it is possible to implement a testing method for the coaxial cable 1 that is subsequently explained in detail in connection with FIG. 9.

Figure 9:
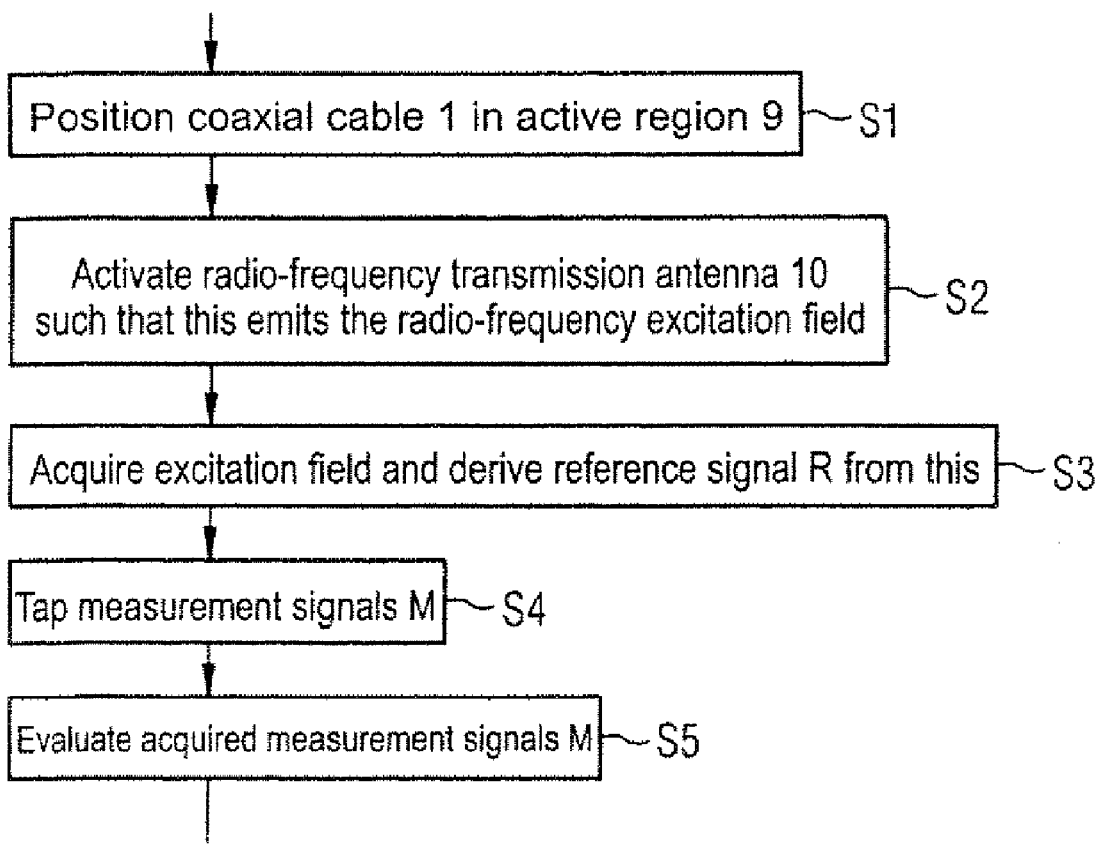
FIGS. 9-11 are flowcharts illustrating a procedure in accordance with an embodiment of the invention.

According to FIG. 9, the coaxial cable 1 is initially positioned in an effective region 9 in a step S1. The step S1 can ensue in a motorized manner or possibly even in an automated manner. However, it is normally implemented by an operating personnel 27.

The radio-frequency transmission antennas 10 is then activated in a step S2 such that this emits the radio-frequency excitation field. The step S2 is normally implemented by the control and evaluation device 8. It is initiated via a corresponding control command by the operating personnel 27.

In an optional step S3 the excitation field can be acquired next and a reference signal R can be derived from this. The reference signal R can also be provided in another manner, for example based on older measurements or on the basis of theoretical considerations. Specifications of the reference signal R based on experiential values of the operating personnel 27 are also considered.

The measurement signals M are tapped in a step S4. This tapping normally ensues via the control and evaluation device 8. A manual tapping (for example, by way of an oscilloscope) is also possible.

The detected measurement signals M are evaluated in a step S5. Here an automatic evaluation by the control and evaluation device 8 is also possible. In the individual case the evaluation can also be directly effected by the operating personnel 27.

Figure 10:
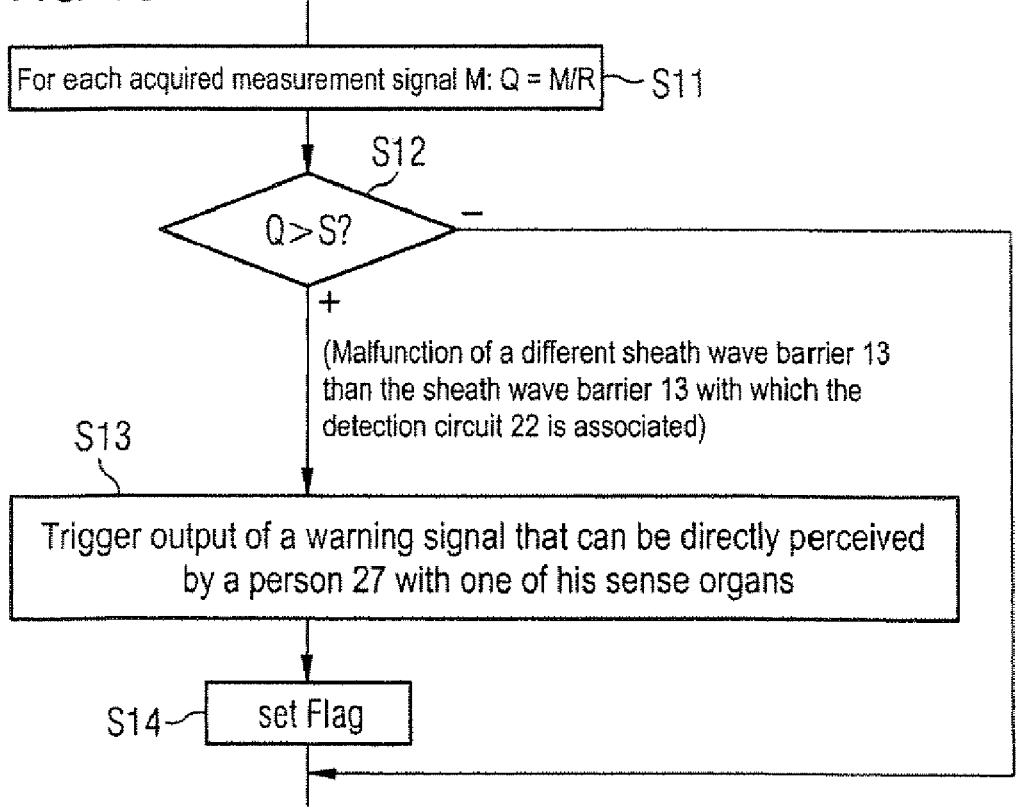

The evaluation of the measurement signals M ensues according to FIG. 10, for example, in that the quotient Q with the reference signal R (see step S3 from FIG. 9) is formed for each acquired measurement signal M in a step S11 and this quotient Q is compared with a threshold value S in a step S12. If the quotient Q lies above the threshold S, a malfunction of a different sheath wave barrier 13 than the sheath wave barrier 13 with which the detection circuit 22 is associated is detected. The evaluation of the measurement signal M thus comprises a comparison of the measurement signal M with the reference signal R.

An output of a warning signal can, for example, be initiated as a reaction to the detection of a malfunction, which warning signal is immediately perceivable by a person (in particular the operating personnel 27) with one of his physical senses. A notification with the content "sheath wave barrier x is excessively loaded" can, for example, be output, whereby x stands for the sheath wave barrier 13 that is excessively loaded. The output of the notification can, for example, ensue via a viewing device 28 that is associated with the control and evaluation device 8. As an alternative or in addition to the output of the optical warning signal, an acoustic warning signal can also be output. Furthermore, as an alternative or in addition to the output of the optical and/or acoustic warning signal, a flag can also be set in a step S14.

Figure 11:
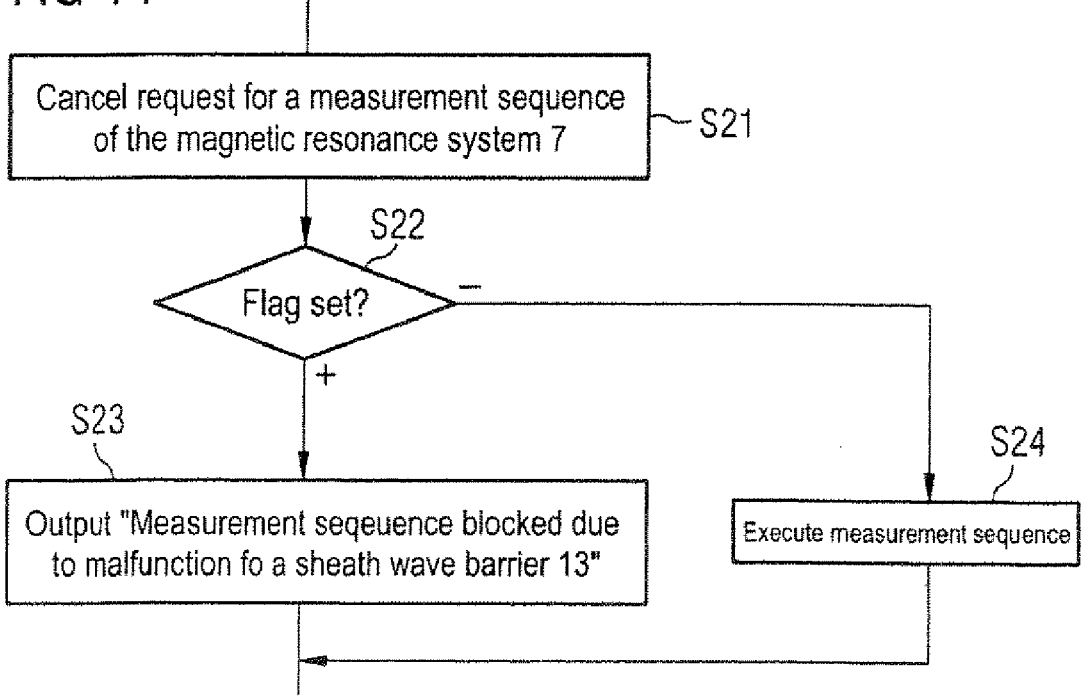

In the event that the step S14 is present, the flag can thus be set and the test of the coaxial cable 1 in a magnetic resonance system 7 is implemented, according to FIG. 11, it is furthermore possible that the control and evaluation device 8 cancels (in a step S21) a request for implementation of a measurement sequence of the magnetic resonance system 7.

Before the execution of the measurement sequence, in a step S22 the control and evaluation device 8 checks whether the flag (see step S14 from FIG. 10) is set. If the flag is set (thus a malfunction of a sheath wave barrier 13 was detected), a corresponding notification is output to the operating personnel 27 in a step S23. The output can again ensue via the viewing device 28. Furthermore, the execution of the measurement sequence is not started.

In contrast, when the flag is not set, the measurement sequence is executed in a step S24. The detection of the malfunction thus initiates a blocking signal (namely the setting of the flag) based on which a start of the measurement sequence is blocked.

The operating safety of the coaxial cable 1 can thus be significantly improved using the present invention. This applies independent the application (magnetic resonance, radar, etc.) in which the coaxial cable 1 should be used. When the test of the coaxial cable 1 ensues in a system, for example, the magnetic resonance system 7, its operating safety can also be improved.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices. Similarly, where the elements of the present invention are implemented using software programming or software elements the invention may be implemented with any programming or scripting language such as C, C++, Java, assembler, or the like, with the various algorithms being implemented with any combination of data structures, objects, processes, routines or other programming elements. Furthermore, the present invention could employ any number of conventional techniques for electronics configuration, signal processing and/or control, data processing and the like. The word mechanism is used broadly and is not limited to mechanical or physical embodiments, but can include software routines in conjunction with processors, etc.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

What is claimed is:

1. A coaxial cable assembly, comprising:
   at least one internal conductor;
   a cable shield surrounding the at least one internal conductor;
   a plurality of sheath wave barriers that are arranged along the cable shield, with each sheath wave barrier comprising two ends, the ends being coupled to the cable shield at coupling points of the cable shield that are spaced from one another, such sheath wave barrier structure serving to dampen sheath waves that are excited on the cable shield due to a radio-frequency magnetic resonance excitation field with an excitation frequency, the excitation field being shielded from the at least one internal conductor with the cable shield;
   a detection circuit having an output signal line associated with at least one of the sheath wave barriers, said detection circuit generating tapped and evaluable measurement signal on the output signal line characteristic of a load of the respective sheath wave barrier due to the excitation field; and
   the detection circuit comprises a rectifier element via which a radio-frequency excitation signal excited in the respective sheath wave barrier by the excitation field is rectified, the measurement signal corresponds to the rectified excitation signal, the measurement signal being used by an evaluator to detect a malfunction of at least one of the sheath wave barriers.

2. The coaxial cable assembly according to claim 1, wherein the respective sheath wave barrier comprises a series circuit of two capacitor elements arranged between the ends of the respective sheath wave barrier and the rectifier element is connected in parallel with one of the capacitor elements.

3. The coaxial cable assembly according to claim 2, wherein the capacitor elements are dimensioned such that, together with the cable shield where it is located between the two coupling points, the combination forms a blocking loop resonant at the excitation frequency.

4. The coaxial cable assembly according to claim 2, wherein the capacitor elements have capacitance values that differ from one another.

5. The coaxial cable assembly according to claim 4, wherein the rectifier element is connected in parallel with that of the capacitor elements that exhibits the greater capacitance value.

6. The coaxial cable assembly according to claim 1, further comprising a capacitive storage element for buffering of the measurement signal that is arranged downstream from the rectifier element.

7. The coaxial cable assembly according to claim 1, wherein the coaxial cable is exposed to a radio-frequency excitation field with an excitation frequency, the excitation field is shielded from the at least one internal conductor with the cable shield, sheath waves that are excited on the cable shield due to the radio-frequency excitation field are dampened with a plurality of sheath wave barriers that respective exhibit two ends that are coupled to the cable shield at coupling points spaced from one another, further comprising:
   an evaluator for tapping and evaluating the measurement signal.

8. The coaxial cable assembly according to claim 1, further comprising:
   the detection circuit comprising a capacitive storage element for buffering the measurement signal.

9. The coaxial cable assembly according to claim 1, further comprising:
   said evaluator evaluating the measurement signal by comparing the measurement signal with a threshold.

10. The coaxial cable assembly according to claim 9, further comprising:
    said evaluator comprising a malfunction detector for detecting a malfunction of a different sheath wave barrier than the sheath wave barrier with which the detection circuit is associated when a quotient of the measurement signal and the reference signal exceeds a threshold value.

11. The coaxial cable assembly according to claim 10, further comprising:
    an output at which the malfunction detector initiates outputting a warning signal that can be directly perceived by a person with his physical senses.

12. The coaxial cable assembly according to claim 10, further comprising:
    said malfunction detector generating a blocking signal that is triggered by the detection of the malfunction on a basis of which a start of a measurement sequence of a system in which the method is implemented is blocked.

* * * * *